United States Patent [19]

Beechko

[11] Patent Number: 4,929,301

[45] Date of Patent: May 29, 1990

[54] ANISOTROPIC ETCHING METHOD AND ETCHANT

[75] Inventor: Nicholas Beechko, South Burlington, Vt.

[73] Assignee: International Business Machines Corporation, Armonk, N.Y.

[21] Appl. No.: 875,833

[22] Filed: Jun. 18, 1986

[51] Int. Cl.$^5$ ............................................. C09K 13/00
[52] U.S. Cl. ................................... 156/657; 156/662; 252/79.1; 252/79.4
[58] Field of Search ................... 252/79.1, 79.5, 79.4; 156/662, 657

[56] References Cited

U.S. PATENT DOCUMENTS

| | | | |
|---|---|---|---|
| 3,457,107 | 7/1969 | Mickelson et al. | 252/79.1 |
| 3,650,957 | 3/1972 | Shipley et al. | 252/79.1 |
| 3,873,203 | 3/1975 | Stevenson | 355/133 |
| 4,229,979 | 10/1980 | Greenwood | 73/704 |
| 4,293,373 | 10/1981 | Greenwood | 156/628 |
| 4,342,817 | 8/1982 | Bohlen et al. | 430/5 |
| 4,417,946 | 11/1983 | Bohlen et al. | 156/643 |

OTHER PUBLICATIONS

IBM Technical Disclosure Bulletin, vol. 15, No. 1, Jun. 1972, p. 173, "Metallic Free Organic Aluminum Etchant", A. J. Hoeg et al.
IBM Technical Disclosure Bulletin, vol. 19, #10, Mar. 1977, p. 3953, "Anisotropic Etching Solution with High Etch Rate On . . .", E. F. Baran et al.
IBM Technical Disclosure Bulletin, vol. 19, #9, Feb. 1977, p. 3623, "Controlled Anisotropic Etching of Single Crystal Silicon", E. Bassous.

*Primary Examiner*—David L. Lacey
*Assistant Examiner*—Thi Dang
*Attorney, Agent, or Firm*—Francis J. Thornton

[57] ABSTRACT

The present invention is directed toward an improved etching solution which is a five component system and does not use ethylene-diamine. This etch will preferentially etch lightly doped, single crystalline silicon at an etch rate of 0.6 microns per minute ±0.05 microns per minute and will effectively stop at a selectively doped level in the silicon body being etched because the etch rate of this selectively doped level drops from 0.6 microns per minute to between 0.001 microns per minute and 0.0006 microns per minute. The etch is comprised of ethanol-amine, piperidine, water, pyrocatechol and 30% hydrogen peroxide. The solution preferably consists of 28 mls. ethanol-amine, 2 mls. piperidine, 5.5 mls. water, 5.5 grams pyrocatechol and 0.25 mls. hydrogen peroxide. If desired a trace of a long chain surfactant can be added to the solution.

7 Claims, No Drawings

ANISOTROPIC ETCHING METHOD AND ETCHANT

BACKGROUND OF THE INVENTION

This invention generally relates to etching solutions and particularly to etching solutions for forming mask elements in silicon wafers.

The present technology of semiconductor devices requires high density device masks which necessitates the developing of line patterns in photoresist of less than one micron in width. Enclosure glass mask formation of such narrow lines is a problem due to the refraction of the light passing through the glass medium when developing the resist necessary to control the chrome erosion.

Electron beam proximity printing techniques which use silicon masks avoid these difficulties. Typical electron beam masks are described in U.S. Pat. Nos. 4,342,817 and 4,417,946, both of which are assigned to the present assignee. Masks shown in these patents have formed hole patterns in two micron thick membranes. Thus, light masking through the holes is not subject to refraction of the light passing through a medium other than that of air. In this way the photoresist, upon development has fewer irregularities than that encountered using the chrome glass mask medium.

In the referenced patents the silicon masks are created in a wet etching solution using an etching solution consisting of ethylene-diamine, pyrocatechol, water, and if necessary hydrogen peroxide solution. Specifically the solution consists of 72 grams of pyrocatechol, 630 mls. of ethylene-diamine, 115 mls. of water and 29 mls. of hydrogen peroxide. This solution, when used at temperatures of about 118° C., is an anisotropic etchant of monocrystalline silicon with the 100 planes etched approximately 16 times quicker than the 111 planes.

SUMMARY OF THE PRESENT INVENTION

The present invention is directed toward an improved etching solution which is a five component system and does not use ethylene-diamine. This etch will preferentially etch lightly doped, single crystalline silicon at an etch rate of 0.6 microns per minute ±0.05 microns per minute and will effectively stop at a selectively doped level in the silicon body being etched because the etch rate of this selectively doped level drops from 0.6 microns per minute to between 0.001 microns per minute and 0.0006 microns per minute. The etch is comprised of ethanol-amine, piperidine, water, pyrocatechol and 30% hydrogen peroxide. The solution preferably consists of 28 mls. ethanol-amine, 2 mls. piperidine, 5.5 mls. water, 5.5 grams pyrocatechol and 0.25 mls. hydrogen peroxide. If desired a force of a long chain surfactant can be added to the solution.

DESCRIPTION OF THE PRESENT INVENTION

The etch is comprised of ethanol-amine, piperidine, water, pyrocatechol and 30% hydrogen peroxide. The solution preferably consists of 28 mls. ethanol-amine, 2 mls. piperidine, 5.5 mls. water, 5.5 grams pyrocatechol and 0.25 mls. hydrogen peroxide.

This solution is made up in the following manner. A two liter resin reaction kettle flask was provided with a condenser, nitrogen purgeline and thermometer. This flask was closed and purged for 20 minutes with nitrogen to remove all oxygen from the system. 925 mls. of ethanol-amine and 66 mls. piperidine together with 181 mls. water and 181 grams pyrocatechol and 1 ml. of a long chain surfactant was then introduced into the flask and heated to between 60°–70° C. for 20 minutes or until a light yellowish-brown color was seen. This color indicates that the pyrocatechol is completely in solution. The solution is then brought to about 70° C. and 8.5 mls. of hydrogen peroxide is added to the solution in the flask and heated to 125° C.±1° C. for a period of approximately 20 minutes. Following this the solution in the flask is ready for etching.

The above described solution can be used with p-doped silicon wafers in the manner described in U.S. Pat. No. 4,342,817. Silicon wafers to be etched should be immersed into the etch solution at 125° C.±1° for 8–10 hours or when the effervescence ceases at the surface of the etch solution. Once the effervescence ceases at the surface of the etch solution the etching of the exposed silicon is completed and the wafers can be removed from the solution, rinsed and dried.

It has also been found that the solution will eliminate precipitation or hillocks on wafers, provided the concentration of the components are controlled. For example, pyrocatechol which is the major component, due to the chelation of the hydrous silica, must be present in excess. Experimental data shows that any hydrous silicon in solution in excess of 6 grams/liter causes precipitation of silicon onto the surface of the wafer. By keeping the concentration of anhydrous silicon below this level or by increasing the pyrocatechol to 15% solution, this silicon precipitation onto the surface of the wafer can be prevented.

The reactions that take place during the etching of silicon using the described solution of the invention are (1) oxidation, (2) chelation with pyrocatechol to form the silico-pyrocatecholate and (3) dissolution of the complex with the strong amine solvents. Hydrogen peroxide (30%) is used in this etch to increase the etch to the desired etch rate by reacting with pyrocatechol to form a quinone-like compound ($RO_2$) or other products which in turn aids the hydroxyl ion in the oxidation of the silicon to $Si(OH)=_6$. The hydrogen peroxide which is a strong oxidant is not directly involved in the etching of silicon, because it can not exist long in a hot alkaline solution due to its fast decomposition rate to $H_2O + O_2$ during bath make-up, and is not present in the bath during etching. Increase or decrease $H_2O_2$ in bath make-up can change etch rate.

Reactions:

Ionization
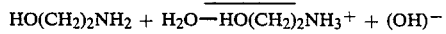
$$HO(CH_2)_2NH_2 + H_2O \rightarrow HO(CH_2)_2NH_3^+ + (OH)^-$$

Oxidation
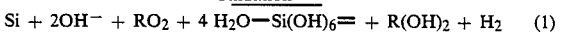
$$Si + 2OH^- + RO_2 + 4H_2O \rightarrow Si(OH)_6^= + R(OH)_2 + H_2 \quad (1)$$

Chelation
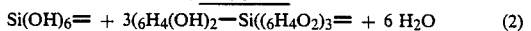
$$Si(OH)_6^= + 3(_6H_4(OH)_2 \rightarrow Si((_6H_4O_2)_3^= + 6H_2O \quad (2)$$

soluble in hot alkaline amine solvents (3)

It should of course be obvious to one skilled in the art that although the preferred embodiment has been described as being performed at a particular temperature and solution concentration that other combinations and temperatures could be readily used and that an adaptation in the process and variation in the solution could be made to accommodate such changes while still remaining within the concepts and purview of the present invention.

While the invention has been particularly described with reference to the preferred embodiments thereof, it should be understood by those skilled in the art that changes in form and detail can be made in the foregoing preferred embodiments without department from the spirit and scope of the invention.

What is claimed is:

1. A method for etching silicon including the steps of preparing an etch solution comprising:

preparing an ethylene-diamine free etch solution comprising ethanol-amine, pyrocatechol, water, piperidine and hydrogen peroxide, applying said etch solution to said silicon at temperatures for time sufficient to affect a desired etched pattern.

2. The method according to claim 1 wherein said hydrogen peroxide is 30% solution.

3. The method of claim 2 wherein the solution comprises 925 mls. ethanol-amine, 66 mls. piperidine, 181 mls. water, 181 grams pyrocatechol, and 8.5 mls. of 30% hydrogen peroxide.

4. The method of claim 1 wherein said solution is heated to a temperature of 125±1° C.

5. An etch solution comprising ethanol-amine, piperidine, water, pyrocatechol and hydrogen peroxide.

6. An etch solution free of ethylene-diamine wherein 925 mls. ethanol-amine, 66 mls. piperidine, 181 mls. water, and 181 grams pyrocatechol is heated to approximately 70° C. until the pyrocatechol is completely in solution, adding 8.5 mls. hydrogen peroxide and heating said solution to 125° C.

7. An etch solution free of ethylene-diamine for etching silicon comprising approximately 55 mole percent of ethanol-amine, approximately 2.3 mode percent of piperidine, approximately 5.8 mole percent of pyrocatechol, and approximately 1 mole percent of hydrogen peroxide.

* * * * *